United States Patent [19]
Tung

[11] Patent Number: 6,127,213
[45] Date of Patent: Oct. 3, 2000

[54] METHOD FOR SIMULTANEOUSLY FORMING LOW VOLTAGE AND HIGH VOLTAGE DEVICES

[75] Inventor: Ming-Tsung Tung, Chu-Tung, Taiwan

[73] Assignee: United Microelectronics Corp., Hsin-Chu, Taiwan

[21] Appl. No.: 09/291,268

[22] Filed: Apr. 14, 1999

[51] Int. Cl.[7] ................................. H01L 21/8238
[52] U.S. Cl. .................... 438/202; 438/207; 438/217; 438/234; 257/370; 257/378
[58] Field of Search ................... 438/202, 207, 438/217, 218, 223, 234, 228, 232, 414; 257/370, 378, 374, 328, 335, 337, 341, 500, 501, 502, 511, 544, 548, 549, 553, 257, 356, 344

[56] References Cited

U.S. PATENT DOCUMENTS

| | | | |
|---|---|---|---|
| 4,918,026 | 4/1990 | Kosiak et al. | 438/207 |
| 5,173,760 | 12/1992 | Min et al. | 257/378 |
| 5,254,487 | 10/1993 | Tamagawa | 438/217 |
| 5,348,896 | 9/1994 | Jang et al. | 438/207 |
| 5,407,844 | 4/1995 | Smayling et al. | 438/234 |
| 5,767,551 | 6/1998 | Smayling et al. | 257/370 |
| 5,843,814 | 12/1998 | Manning | 438/202 |
| 5,856,695 | 1/1999 | Ito et al. | 257/370 |

*Primary Examiner*—Donald L. Monin, Jr.
*Assistant Examiner*—Hoai Pham
*Attorney, Agent, or Firm*—Harness, Dickey & Pierce, P.L.C.

[57] ABSTRACT

An improved method for simultaneously forming low voltage and high voltage devices is disclosed. The method includes using gradient doping to generate the gradient concentration in a semiconductor such that can tolerate higher threshold voltage. The device can get higher driving current by using gradient doping only in drain regions in metal-oxide-semiconductor field effect transistor (MOSFET). In addition, the invention can simultaneously generate higher current gain bipolar junction transistor (BJT) for applied integrated circuit. Further more, the invention can meet small layout rule of low voltage device and the only drain region to be operated in a high voltage device.

10 Claims, 6 Drawing Sheets

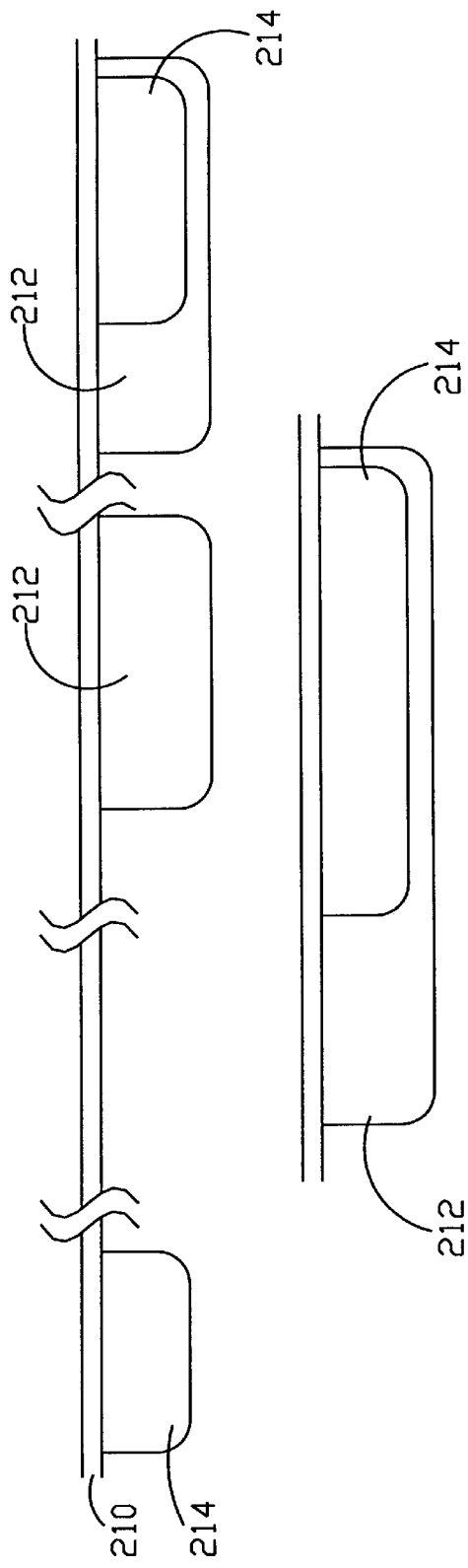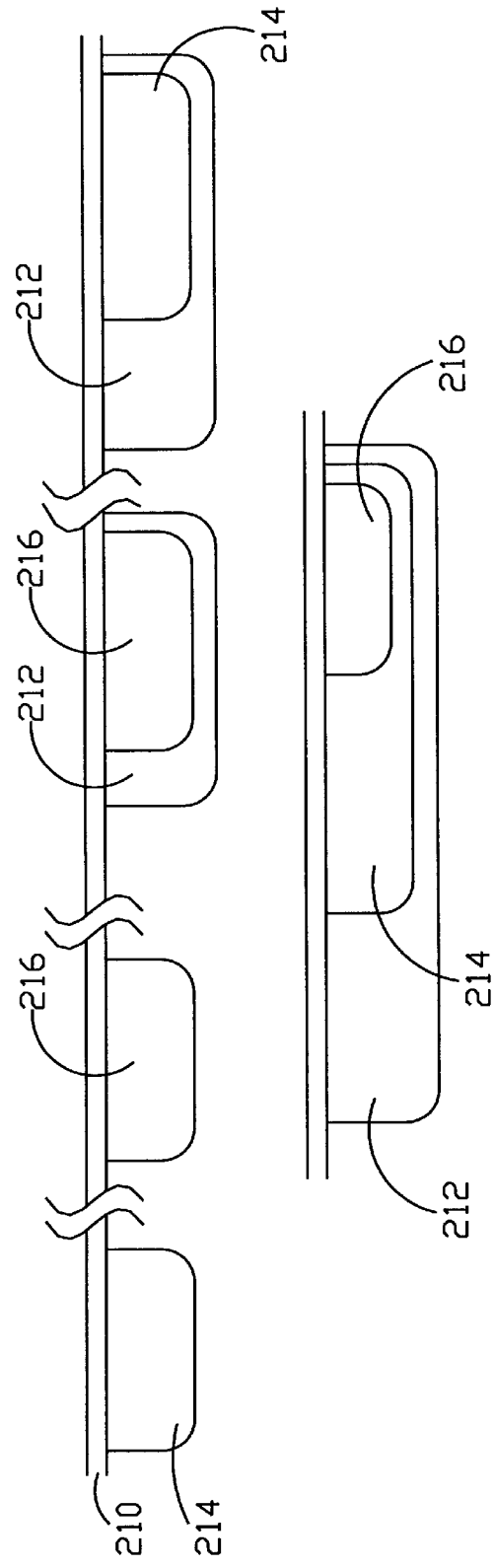

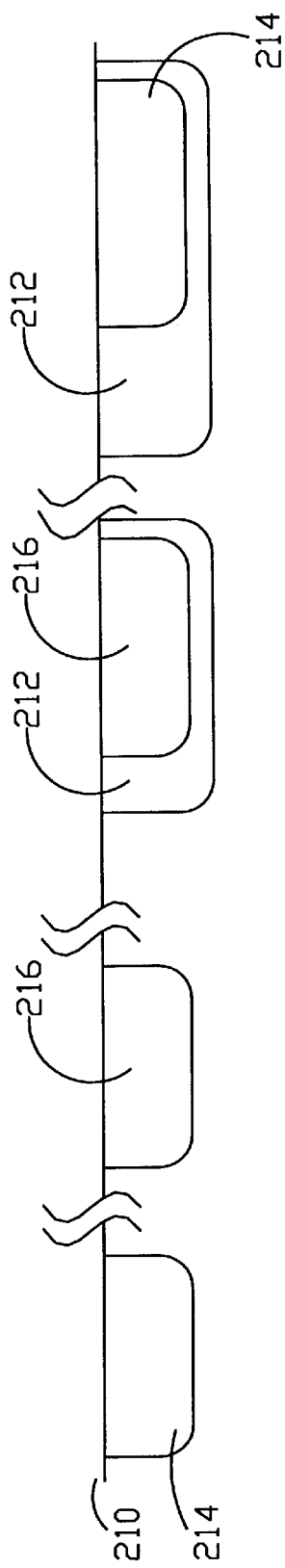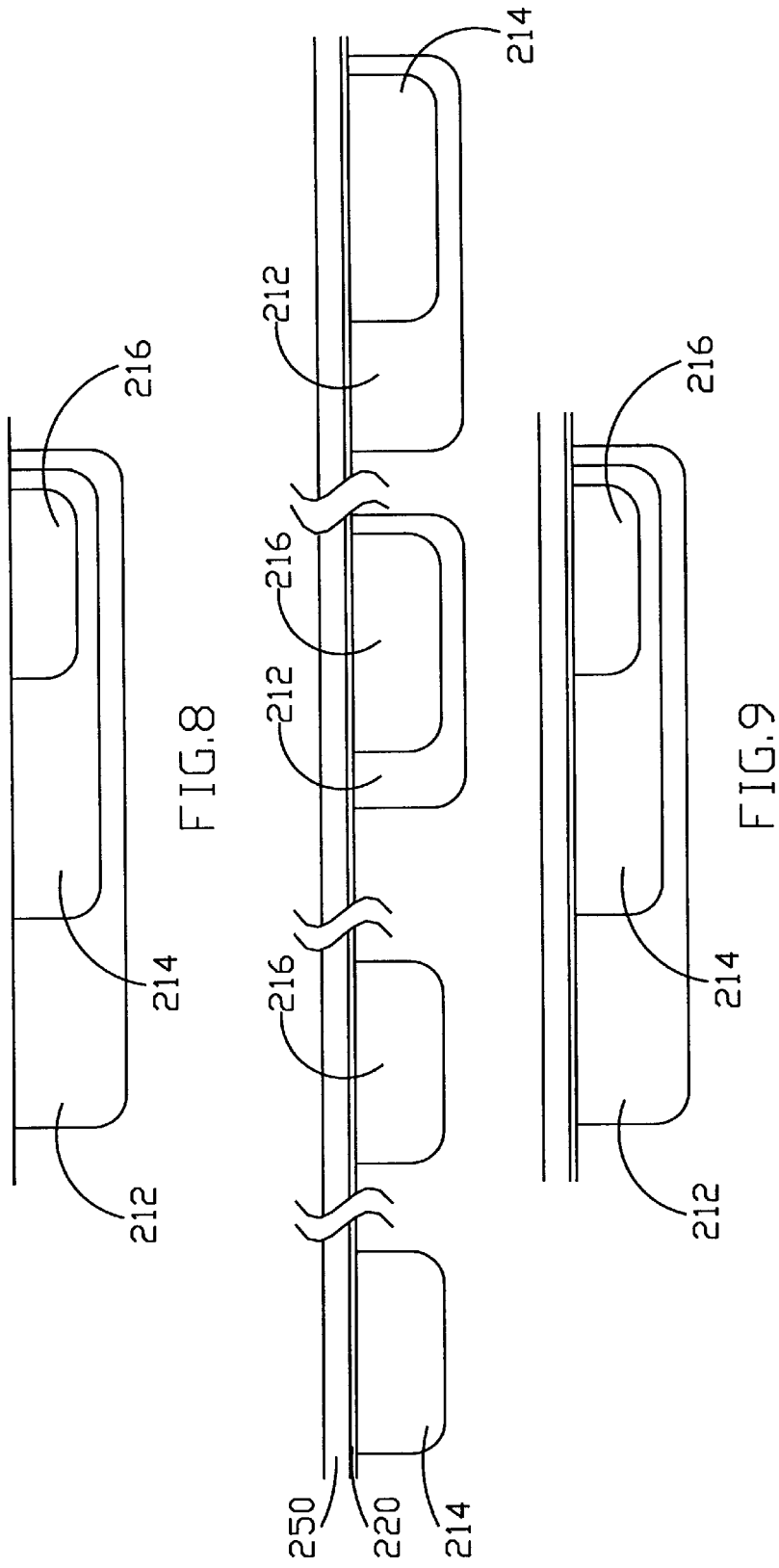

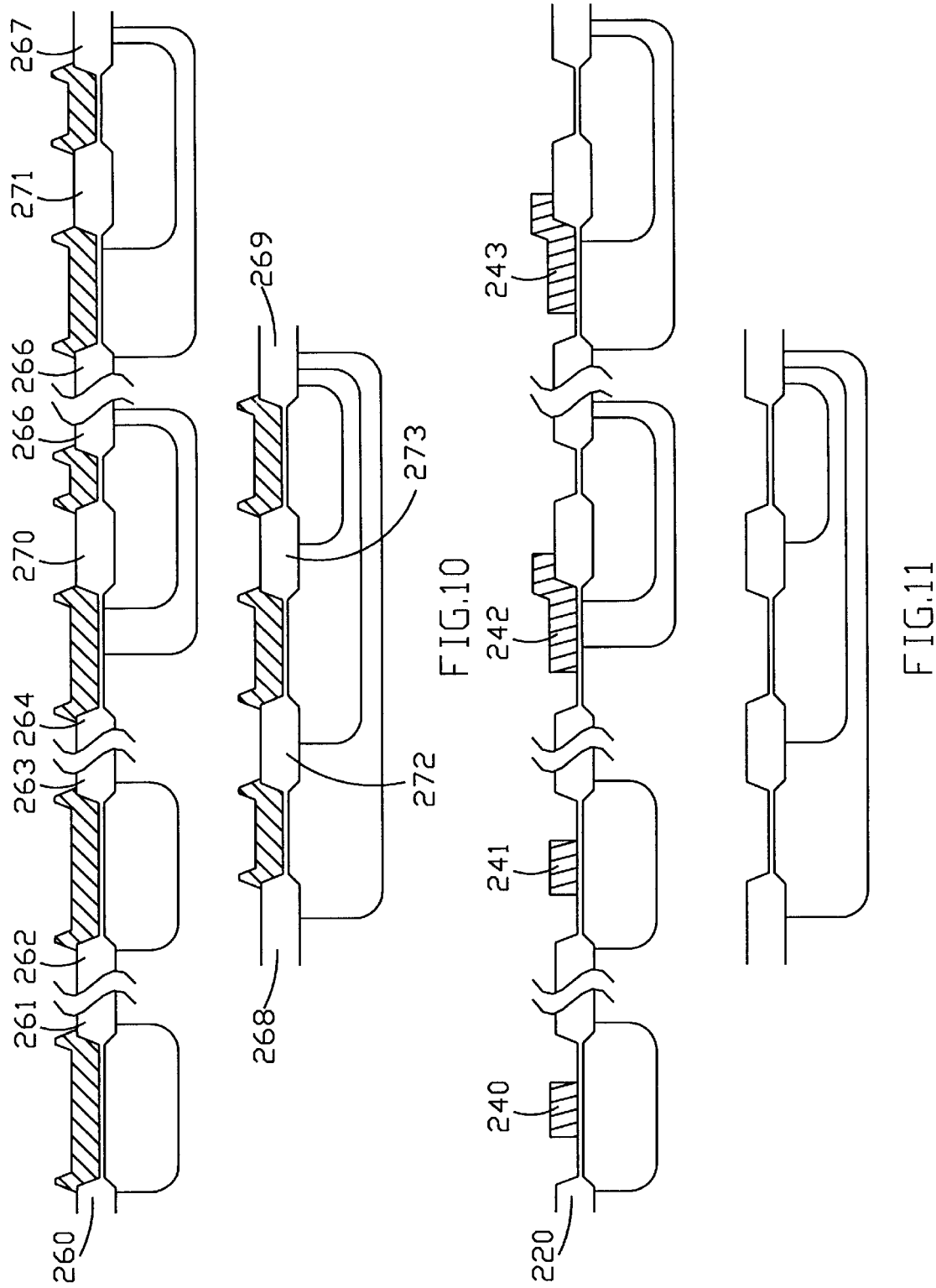

METHOD FOR SIMULTANEOUSLY FORMING LOW VOLTAGE AND HIGH VOLTAGE DEVICES

BACKGROUND OF THE INVENTION

1. Field of the Invention

The present invention relates to the low voltage device and high voltage device fabrication, and further particularly to a method for simultaneously forming low voltage device and high voltage device.

2. Description of the Prior Art

Recently, demand for semiconductor devices has rapidly increased owing to widespread use of electronic equipment. In particular, the increasing popularity of some electronic equipment such as, for example, computers, is increasing the demand for large semiconductor device. Integrated circuit (IC) for periphery of computer, for example, the IC in the monitor and input/output circuit simultaneously needs controlling circuit and driving IC. In most cases, low voltage device is used for the control circuit while high voltage device is used for driving IC. However, except for the above devices many devices need integrated low voltage and high voltage devices, for example, the liquid crystal display in the notebook and electric devices in a watch. Hence, integrated low voltage and high voltage devices are used in many places.

A conventional metal-oxide-semiconductor field effect transistor (MOSFET) is shown by FIG. 1, and particularly for N channel MOSFET where source region 130A and drain region 130B are N+, substrate 110 is p-well and gate 150 is polysilicon. The MOSFET in FIG. 1 that can only accept low voltage such as 5 V or 3 V is a standard low voltage device. A low voltage P channel MOSFET can be formed similarity. When the integrity in the semiconductor devices is increasing, one N channel MOSFET that can prevent short channel effect is designed in FIG. 2. Such design is called lightly doped drain (LDD), wherein the concentration of LDD 133A/133B is more light than source/drain regions 132A/132B with gate 152 and source/drain regions 132A/132B as well as FIG. 1. The LDD design increases the dissipation of energy, and one high voltage MOSFET is designed in FIG. 3 which shows N channel MOSFET wherein the light concentration is lightly doped regions 133A/133B and field oxide layer 140A/140B prevents gate region 154 and source/drain regions 134A/134B short-circuit under high voltage.

In conventional low voltage and high voltage devices, only the drain region needs to be operated under high voltage, so a serial resist is usually connected to source region as is shown in FIG. 3. This makes lower driving current and can not tolerate higher threshold voltage. In addition, the low voltage device for controlling the current generally need small layout rule and high voltage device for driving IC only needs drain region to be operated under high voltage, the devices in FIG. 1 and FIG. 3 can not meet the above requirement.

SUMMARY OF THE INVENTION

In accordance with the present invention, a method is provided for simultaneously forming low voltage and high voltage devices that substantially meet small layout rule of control circuit of low voltage device and the operation of drain region of high voltage. In one embodiment, gradient doping in BJT and drain region are used only in MOSFET. Doped concentration increased with increasing doping order is in order to generate higher threshold voltage. The following is forming field isolation region between different concentration regions of gradient doping region to prevent gate region and drain region short-circuit in MOSFET also appeared in BJT. The gate region is formed in MOSFET wherein the gate region will be formed partially over field isolation region between different concentration regions in high voltage MOSFET. Source/drain regions are formed in MOSFET while emitter/base/collector regions are formed in BJT simultaneously.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein:

FIG. 4 to FIG. 12 show cross-sectional views illustrative of various stages in the present invention.

DESCRIPTION OF THE PREFERRED EMBODIMENT

Figure 1:
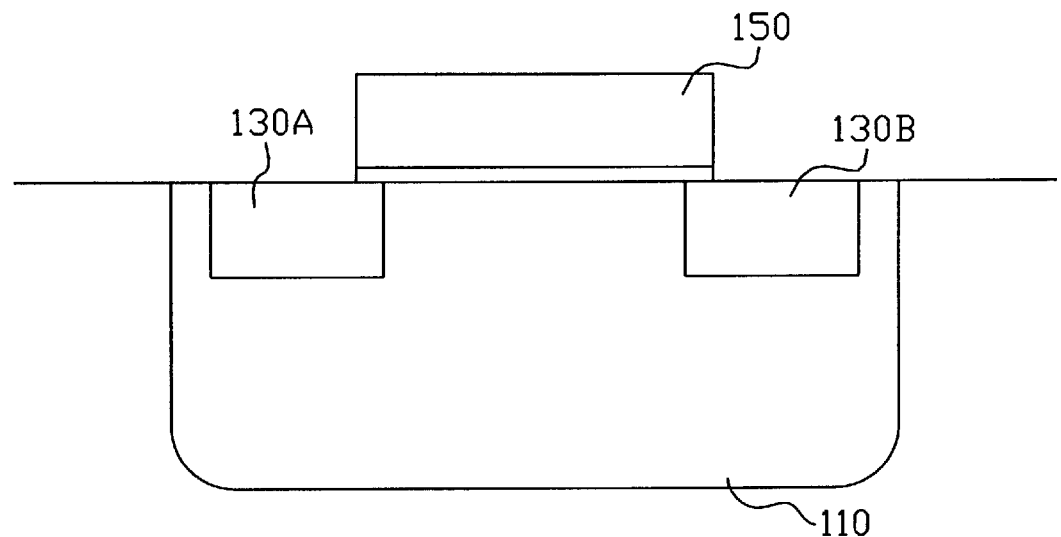
FIG. 1 shows a conventional MOSFET.
Figure 2:
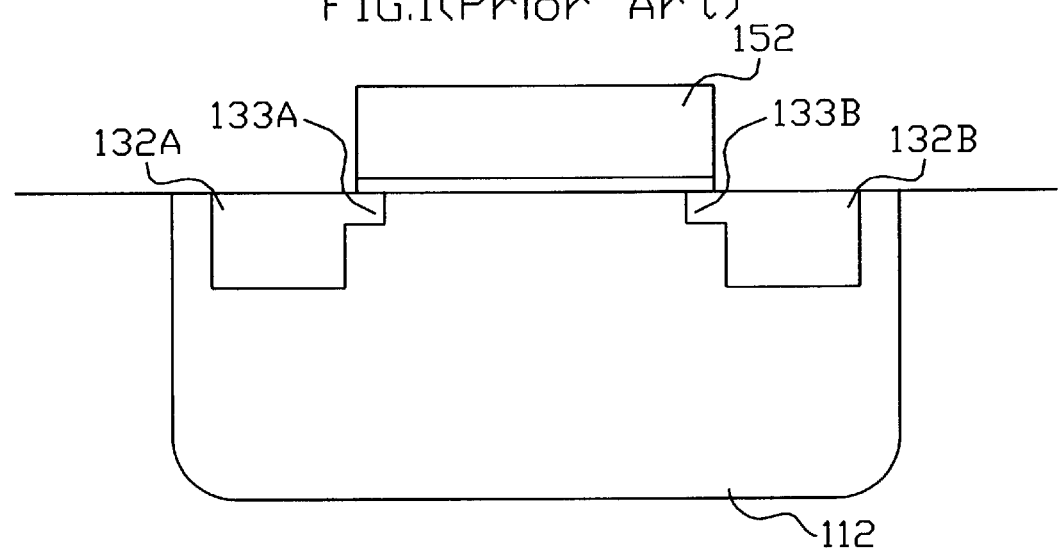
FIG. 2 shows a conventional LDD MOSFET.
Figure 3:
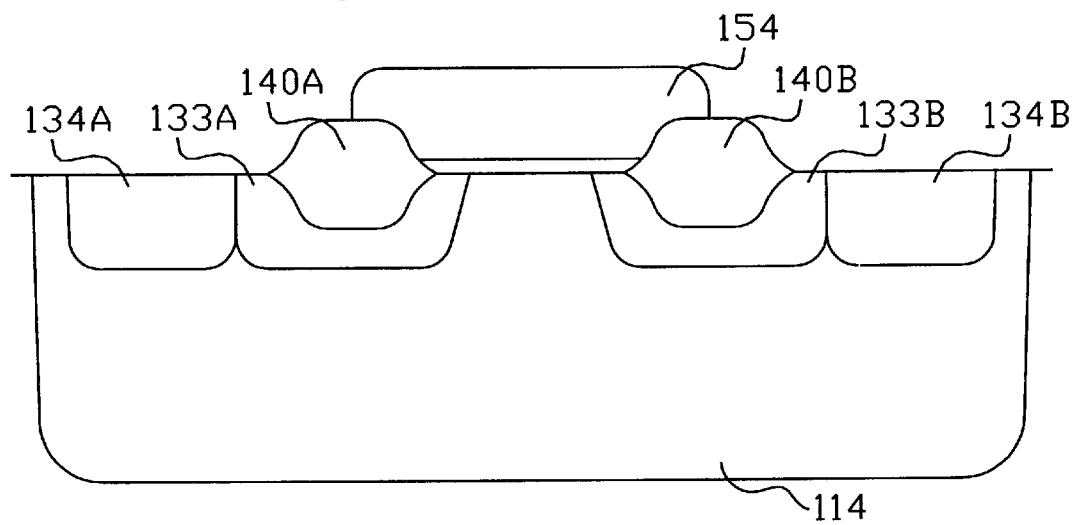
FIG. 3 shows a conventional high voltage MOSFET.
Figure 4:
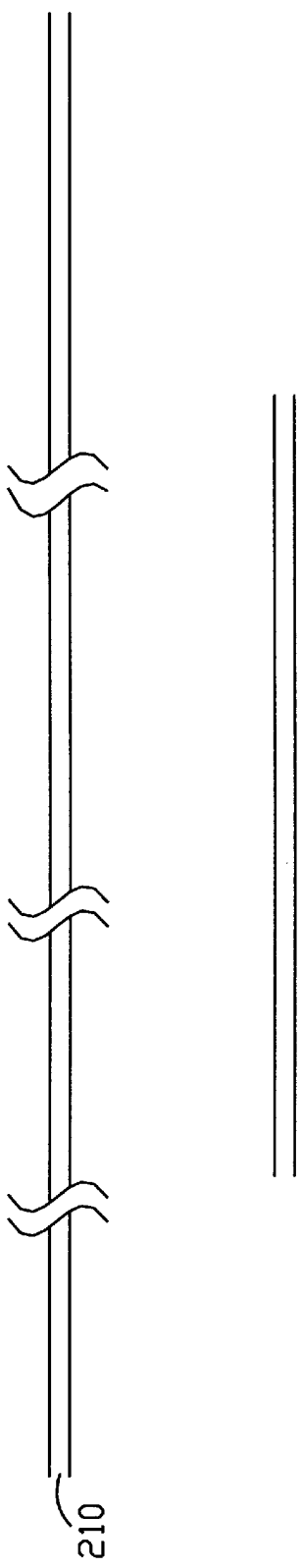

The embodiment discloses simultaneously forming N channel low voltage metal-oxide-semiconductor field effect transistor (MOSFET), P channel low voltage MOSFET, N channel high voltage MOSFET, P channel high voltage MOSFET and bipolar junction transistor (BJT). Referring to FIG. 4, N channel low voltage MOSFET, P channel low voltage MOSFET, N channel high voltage MOSFET, P channel high voltage MOSFET and BJT having P channel substrates are placed in sequence. An oxide layer 210 is deposited above all devices using a conventional low pressure chemical vapor deposition (LPCVD) or PECVD process. The thickness of the oxide layer 210 is about 200 angstroms, but range about 150 to 300 angstroms.

Figure 5:
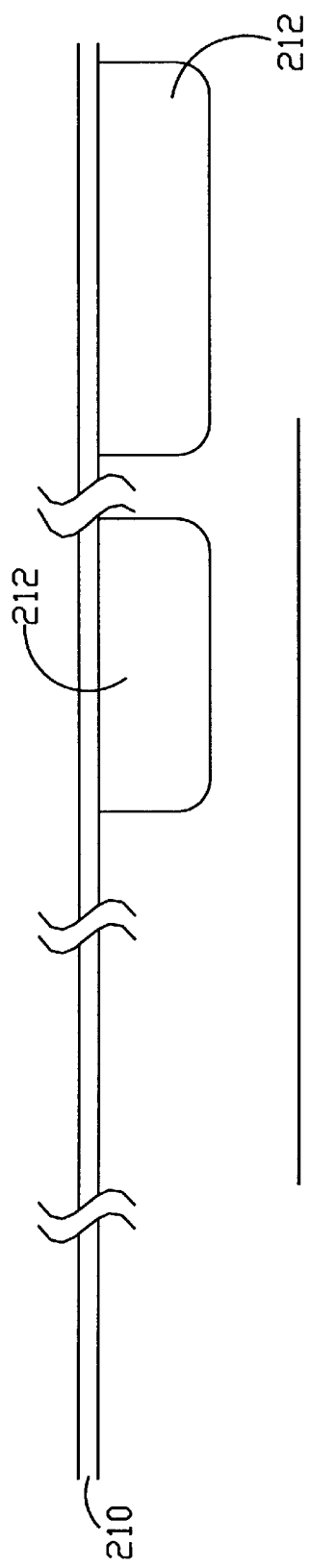
Figure 12:
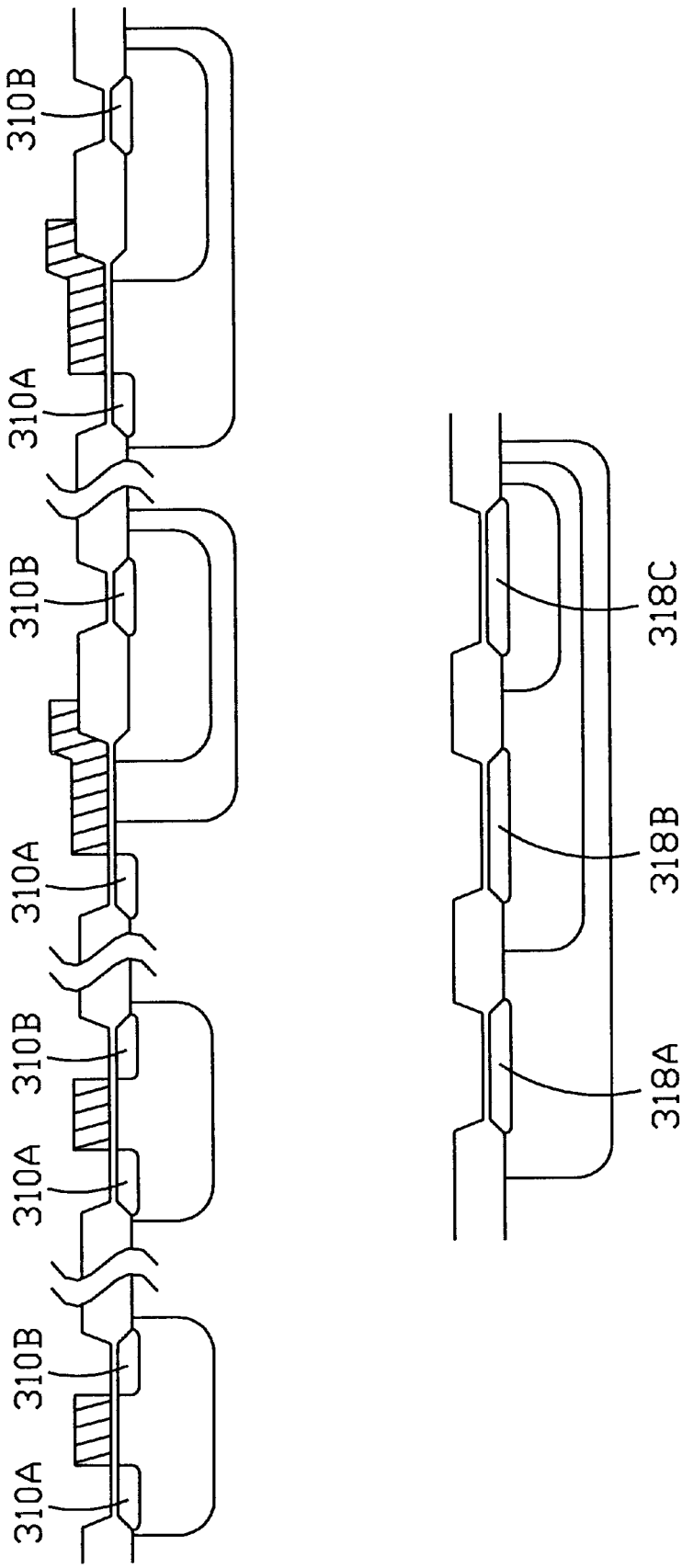

Three $n_1$ regions 212 are formed in N channel high voltage MOSFET, P channel high voltage MOSFET and BJT. In this embodiment, all $n_1$ regions 212 are formed by ion implantation at desired distance. The $n_1$ region 212 in N channel high voltage MOSFET is spaced from source region 310A in FIG. 12, and the other $n_1$ regions 212 in P channel high voltage MOSFET and BJT are full of size, as show in FIG. 5. Three p1 regions 214 are formed in N channel low voltage MOSFET, P channel high voltage MOSFET and BJT. In this embodiment, all p1 regions 214 are also formed by ion implantation at desired distance. The p1 regions 214 in P channel high voltage MOSFET and BJT are enclosed in the n1 regions and the residual p1 region 214 in N channel low voltage MOSFET is full of size, as show in FIG. 6. The doping concentration of this implantation step will be heavier than the previous step. Three $n_2$ regions 216 are formed in P channel low voltage MOSFET, N channel high voltage MOSFEIT and BJT. In this embodiment, all n2 regions 216 are formed by ion implantation at desired distance. The $n_2$ region 216 in N channel high voltage MOSFET is enclosed by n1 region 212 while n2 region in BJT is enclosed by p1 region 214, and the residual $n_2$ region in P channel low voltage MOSFET is full of size, as show in FIG. 7. The doping concentration of this implantation step will be heavier than the previous step.

The oxide layer 210 is etched in all devices, as show in FIG. 8. A pad oxide 220 is deposited on all devices and then silicon nitride layer 250 is formed on pad oxide layer 220. The thickness of the pad oxide layer 220 is about 150 angstroms, but range about 100 to 300 angstroms. The thickness of the silicon nitride layer 250 is about 1500 angstroms, but range about 1000 to 3000 angstroms, as show in FIG. 9. Field insulator regions 260–273 are formed between all devices and also formed among n1 regions 212, p1 regions 214 and n2 regions 216 in high voltage MOSFET and BJT. Field isolation may comprise field oxide regions formed by known LOCOS (local oxide of silicon process), as shown in FIG. 10. In the preferred embodiment process flow, the gate regions 240–243 are formed next. The gate regions 240–243 may be formed by blanket deposition of polysilicon followed by a patterned etch. The polysilicon may be in situ doped or doped after deposition. The gate regions 242–243 in high voltage MOSFET are partially over field isolation regions 270–271, as show in FIG. 11. The source/drain regions 310A and 310B are next formed preferably by ion implantation in MOSFET while the emitter/base/collector regions 318A, 318B and 318C are simultaneously formed preferably by ion implantation, as show in FIG. 12. The doping concentration of this implantation step will heavier than the previous step of n2 regions 216.

Although specific embodiments have been illustrated and described, it will be obvious to those skilled in the art that various modifications may be made without departing from what is intended to be limited solely by the appended claims.

What is claimed is:

1. A method of simultaneously forming low voltage device and high voltage device on a chip, said method comprising:
   providing a substrate of said low voltage device area and high voltage device area;
   forming a first well in a low voltage metal-oxide-semiconductor field effect transistor (MOSFET);
   forming a first well and a second well in a high voltage MOSFET, such that said second well is enclosed by said first well;
   forming a first well, a second well and a third well in a bipolar junction transistor (BJT), such that said third well is enclosed by second well as well as said second well is enclosed by the first well;
   forming field isolation regions among said low voltage MOSFET, high voltage MOSFET and BJT and also approximately on junction areas between said first well and said second well of said high voltage MOSFET and also forming field isolation regions between said first well and said second well as well as said second well and said third well;
   forming gate regions on each said low voltage MOSFET and said high voltage MOSFET such that said gate region in high voltage MOSFET is partially over said field isolation region between said first well and said second well; and
   forming source/drain regions in said low voltage MOSFET and high voltage MOSFET by implantation using gate regions while forming emitter/base/collector regions in BJT.

2. The method of claim 1, wherein the polarity of said first well is opposite to said second well in BJT and the polarity of said first well is the same as third well.

3. The method of claim 1, wherein the concentration of said source/drain regions is larger than said second well and said second well is larger than said first well in high voltage MOSFET.

4. The method of claim 1, wherein the concentration of said emitter/base/collector regions is larger than said third well and said third is larger than said second well and said second well is larger than said first well in BJT.

5. The method of claim 1, wherein said field isolation is field oxide region.

6. The method of claim 1, wherein said substrate is P channel and said low voltage device is N channel MOSFET when said first well is p-well, said low voltage device is P channel MOSFET when said first well is n-well, said high voltage device is N channel MOSFET when said second well is n-well with said first well is n-well and said high voltage device is P channel MOSFET when said second well is p-well with said first well is n-well.

7. A method of simultaneously forming low voltage devices, high voltage devices and bipolar junction transistor on a chip, said method comprising:
   providing a substrate of a first low-voltage device area, second low-voltage device area, first high-voltage device area, second high-voltage device area, and a bipolar junction transistor;
   forming first conductive regions in the first conductivity in the first high-voltage device area, the second high-voltage device area, and the bipolar junction transistor respectively;
   forming second conductive regions in the first low-voltage device area, second high-voltage device area, and a bipolar junction transistor, such that said second conductive regions in the second high voltage device area and bipolar junction transistor are enclosed by first conductive regions;
   forming third conductive regions in the second low-voltage device area, first high-voltage device area, and a bipolar junction transistor such that said third conductive regions are enclosed by first conductive region of first high voltage device area and by second conductive region of bipolar junction transistor;
   forming field isolation regions among said first low-voltage device area, second low-voltage device area, first high-voltage device area, second high-voltage device area, and a bipolar junction transistor, and also approximately on a junction area between said first conductive region with the second conductive region, said second conductive region with the third conductive region, and said third conductive region with the first conductive region;
   forming gate regions on each first low-voltage device area, second low-voltage device area, first high-voltage device area and second high-voltage device area;
   forming source/drain regions in said first low-voltage device area, second low-voltage device area, first high-voltage device area and second high-voltage device area by implantation using gate regions, and also forming collector and emitter regions in said bipolar junction transistor.

8. The method of claim 7, wherein said field isolation is field oxide region.

9. The method of claim 7, wherein the polarity of said first conductive region is opposite to said second conductive region and the polarity of said first conductive region is the same as third conductive region.

10. The method of claim 7, wherein the concentration of said source/drain/emitter/base/collector regions is larger than said third well and said third is larger than said second well and said second well is larger than said first well.

* * * * *